United States Patent
Park (10) Patent No.: US 11,288,157 B2
(45) Date of Patent: Mar. 29, 2022

(54) CONTROLLER AND OPERATION METHOD THEREOF

(71) Applicant: SK hynix Inc., Icheon (KR)

(72) Inventor: Youn-Won Park, Suwon (KR)

(73) Assignee: SK hynix Inc., Icheon (KR)

( * ) Notice: Subject to any disclaimer, the term of this patent is extended or adjusted under 35 U.S.C. 154(b) by 306 days.

(21) Appl. No.: 16/721,703

(22) Filed: Dec. 19, 2019

(65) Prior Publication Data

US 2020/0379861 A1    Dec. 3, 2020

(30) Foreign Application Priority Data

May 31, 2019 (KR) .......................... 10-2019-0064392

(51) Int. Cl.
*G06F 11/30* (2006.01)
*G06F 11/07* (2006.01)
(Continued)

(52) U.S. Cl.
CPC ........ *G06F 11/3037* (2013.01); *G06F 9/4418* (2013.01); *G06F 11/076* (2013.01);
(Continued)

(58) Field of Classification Search
CPC ............... G06F 11/3037; G06F 9/4418; G06F 11/0757; G06F 11/076; G06F 12/0246; G06F 12/0253; G06F 12/0811; G06F 13/1668; G06F 2212/1016; G06F 2212/1032; G06F 2212/7201; G06F 2212/7205; G06F 2212/7208; G06F 11/073; G06F 11/3058; G06F 11/3409;
(Continued)

(56) References Cited

U.S. PATENT DOCUMENTS

| | | | | |
|---|---|---|---|---|
| 7,949,795 B2* | 5/2011 | Yoneyama | ............ | G06F 1/3203 710/5 |
| 2012/0297174 A1* | 11/2012 | Frank | .................... | G06F 9/5011 713/1 |

(Continued)

FOREIGN PATENT DOCUMENTS

| | | | |
|---|---|---|---|
| KR | 20090004846 U | 5/2009 | |
| KR | 20160124990 A | 10/2016 | |

(Continued)

*Primary Examiner* — Masud K Khan (57) ABSTRACT

A controller controlling a memory device includes an elapsed time calculator receiving a plurality of absolute times from a host when a state of a memory system including the memory device is changed between an active state and an inactive state, the plurality of absolute times including first, second, and third absolute times, calculating an average hibernation time interval between the first and second absolute times, and calculating a system time based on the third absolute time and the average hibernation time interval. The controller further includes a flash translation layer calculating expected usage of the memory device during a monitoring time interval based on the system time, calculating excess usage based on actual usage of the memory device during the monitoring time interval and the expected usage, and controlling the memory device to program data in a single level cell mode until the excess usage is fully consumed.

20 Claims, 8 Drawing Sheets

(51) Int. Cl.

| | |
|---|---|
| *G06F 12/02* | (2006.01) |
| *G06F 12/08* | (2016.01) |
| *G06F 13/16* | (2006.01) |
| *G06F 9/44* | (2018.01) |
| *G11C 16/34* | (2006.01) |
| *G06F 12/0811* | (2016.01) |
| *G06F 9/4401* | (2018.01) |

(52) U.S. Cl.
CPC ...... *G06F 11/0757* (2013.01); *G06F 12/0246* (2013.01); *G06F 12/0253* (2013.01); *G06F 12/0811* (2013.01); *G06F 13/1668* (2013.01); *G11C 16/349* (2013.01)

(58) Field of Classification Search
CPC .... G06F 3/0614; G06F 3/0634; G06F 3/0616; G06F 1/3225; G06F 3/0625; G06F 3/064; G06F 3/0653; G06F 3/0658; G11C 16/349; G11C 16/10; G11C 16/3495; G11C 2211/5641
See application file for complete search history.

(56) References Cited

U.S. PATENT DOCUMENTS

2016/0179158 A1\* 6/2016 Thomas ................ G06F 1/3296
 713/340
2019/0050048 A1\* 2/2019 Kang .................... G06F 1/3296

FOREIGN PATENT DOCUMENTS

| KR | 20170042985 A | 4/2017 |
|---|---|---|
| KR | 20200137682 A | 12/2020 |

\* cited by examiner

| | | | | 150 |
|---|---|---|---|---|
| VALID | ERASE | ERASE | ERASE | VALID |
| VALID | ERASE | ERASE | ERASE | VALID |
| VALID | ERASE | ERASE | ERASE | VALID |
| VALID | ERASE | ERASE | ERASE | VALID |
| VALID | ERASE | ERASE | ERASE | ERASE |
| VALID | ERASE | ERASE | ERASE | ERASE |
| VALID | ERASE | ERASE | ERASE | ERASE |
| VALID | ERASE | ERASE | ERASE | ERASE |
| VALID | ERASE | ERASE | ERASE | ERASE |
| INVALID | ERASE | ERASE | ERASE | ERASE |
| BLOCK1 | BLOCK2 | BLOCK3 | BLOCK4 | BLOCK5 |

CONTROLLER AND OPERATION METHOD THEREOF

CROSS-REFERENCE TO RELATED APPLICATION

This application claims priority under 35 U.S.C. § 119 to Korean Patent Application No. 10-2019-0064392 filed on May 31, 2019, which is incorporated herein by reference in its entirety.

BACKGROUND

1. Field

Embodiments of the present disclosure relate to a memory system.

2. Discussion of the Related Art

The computer environment paradigm has been transitioning to ubiquitous computing, which enables computing systems to be used anytime and anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Such memory systems may have excellent stability and durability, a high information access speed, and low power consumption. Examples of these memory systems include universal serial bus (USB) memory devices, memory cards having various interfaces, and solid state drives (SSD).

SUMMARY

Various embodiments are directed to a memory system that operates based on an estimated current time and an operating method thereof. Such a memory system may have better reliability compared to a conventional memory system.

In an embodiment, there is provided a controller controlling a memory device. The controller may include: an elapsed time calculator suitable for receiving a plurality of absolute times from a host when a state of a memory system including the memory device is changed between an active state and an inactive state, the plurality of absolute times including first, second, and third absolute times, calculating an average hibernation time interval in an active state time interval between the first and second absolute times, and calculating a system time based on the third absolute time and the average hibernation time interval; and a flash translation layer (FTL) suitable for calculating expected usage of the memory device during a monitoring time interval based on the system time, calculating excess usage based on actual usage of the memory device during the monitoring time interval and the expected usage, and controlling the memory device to program data in a single level cell mode until the excess usage is fully consumed.

In an embodiment, there is provided a controller controlling a memory device. The controller may include: an elapsed time calculator suitable for receiving a plurality of absolute times from a host when a state of a memory system including the memory device is changed between an active state and an inactive state, the plurality of absolute times including first, second and third absolute times, calculating an average hibernation time interval in an active state time interval between the first and second absolute times, and calculating a system time based on the third absolute time and the average hibernation time interval; and a flash translation layer (FTL) suitable for performing a garbage collection operation based on whether the number of free blocks in the memory device is less than a threshold, calculating expected usage of the memory device during a monitoring time interval based on the system time, calculating excess usage based on actual usage of the memory device during the monitoring time interval and the expected usage, and changing the threshold until the excess usage is fully consumed.

DETAILED DESCRIPTION

Various embodiments will be described below in more detail with reference to the accompanying drawings. Embodiments of the present disclosure may, however, be embodied in different forms and should not be construed as limited to the embodiments set forth herein. Rather, these embodiments are provided so that this disclosure will be thorough and complete, and will fully convey the scope of various embodiments of the present disclosure to those skilled in the art. Throughout the disclosure, like reference numerals refer to like parts throughout the various figures and embodiments of the present disclosure.

Hereinafter, various embodiments of this disclosure are described in detail with reference to the accompanying drawings. It is to be noted that in the following description, only a part necessary to understand operations according to various embodiments are described and a description of other parts will be omitted in order to clearly describe the gist of the disclosure.

Various embodiments are described in more detail below with reference to the accompanying drawings.

Figure 1:
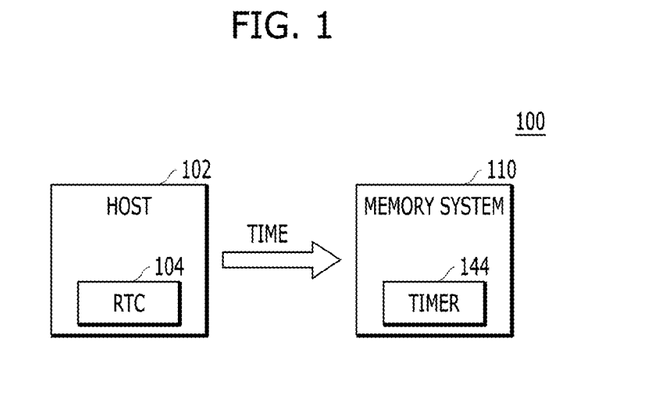
FIG. 1 is a diagram schematically illustrating an example of a data processing system including a memory system according to an embodiment of this disclosure.

FIG. 1 is a block diagram illustrating a data processing system 100 in accordance with an embodiment of the present disclosure.

Referring to FIG. 1, the data processing system 100 may include a host 102 operatively coupled to a memory system 110.

The host 102 may include any of various portable electronic devices such as a mobile phone, an MP3 player, and a laptop computer, or any of various non-portable electronic devices such as a desktop computer, a game machine, a television (TV), and a projector.

The host 102 may include at least one operating system (OS), which may manage and control overall functions and operations of the host 102, and control an operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user.

For example, the personal OS configured to support a function of providing a service to general users may include Windows and Chrome, and the enterprise OS configured to secure and support high performance may include Windows server, Linux, and Unix. Furthermore, the mobile OS configured to support a function of providing a mobile service to users and a power saving function of a system may include Android, iOS, and Windows Mobile. The host 102 may include a plurality of OSs, and execute an OS to perform an operation corresponding to a user's request on the memory system 110.

The memory system 110 may operate to store data for the host 102 in response to a request of the host 102. Non-limiting examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card, and memory stick. The MMC may include an embedded MMC (eMMC), reduced size MMC (RS-MMC), micro-MMC, and the like. The SD card may include a mini-SD card and micro-SD card.

The memory system 110 may be embodied by various types of storage devices. Examples of such storage devices may include, but are not limited to, volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM or ReRAM), and a flash memory. The flash memory may have a 3-dimensional (3D) stack structure.

The host 102 can be aware of a current time. FIG. 1 illustrates the host 102 capable of being aware of a current time using a real-time clock (RTC) 104. The memory system 110 may receive time information indicative of a specific time (e.g., a current time) from the host 102.

The memory system 110 may include a timer 144. The memory system 110 may calculate a system time based on an absolute time received from the host 102 and an elapsed time interval measured by the timer 144.

The memory system 110 may have any one of a plurality of power states. For example, the memory system 110 may have any one of an active state, a sleep state, and a power-off state.

In the active state, the memory system 110 may receive all types of requests from the host 102. The active state may include a busy state and a hibernation state.

In the busy state, the memory system 110 may operate in response to a request from the host 102 or may perform a background operation. In the busy state, the memory system 110 may use all types of supported commands. The memory system 110 may switch to the hibernation state when the memory system does not operate for a given elapsed time interval, for example, for 1 ms or more in the busy state. The hibernation state is the state in which the memory system 110 does not perform an operation corresponding to a request from the host 102 and a background operation. In the hibernation state, the memory system 110 may stop the operation of the timer 144 in order to reduce power consumption. The memory system 110 may receive all types of requests from the host 102 even in the hibernation state. The memory system 110 may switch from the hibernation state to the busy state when the memory system 110 needs to resume an operation.

The memory system 110 may switch from the active state to the sleep state in response to a request from the host 102. For example, if the state of the memory system 110 is a power-on state, but a user does not use the host 102, the host 102 may provide a sleep request to the memory system 110. In the sleep state, supplying some power to the memory system 110 may be stopped. In the sleep state, the memory system 110 may operate only in response to some types of requests received from the host 102. For example, in the sleep state, the memory system 110 may change a power state in response to a request for changing the power state. For example, in the sleep state, the memory system 110 may provide the host 102 with sense data indicative of the current state of the memory system 110 in response to a sense data request. Power consumption of the memory system 110 in the sleep state is smaller than power consumption of the memory system 110 in the hibernation state. The memory system 110 may switch to the active state in response to a sleep release request from the host 102.

The memory system 110 may switch from the active state or the sleep state to the power-off state in response to a request from the host 102. For example, when the host 102 itself performs a power-off operation, it may provide a power-off request to the memory system 110. In the power-off state, supplying the entire power to the memory system 110 may be stopped, and all of volatile data stored in an internal memory may be lost. In the power-off state, the memory system 110 may operate in response to only some types of requests received from the host 102. For example, in the power-off state, the memory system 110 may operate in response to only a request for changing the power state or a sense data request. The memory system 110 may switch to the active state in response to a power-on request from the host 102.

The timer 144 does not operate in the sleep state and the power-off state. In addition, the timer 144 may not operate in the hibernation state. The memory system 110 can measure one or more elapsed time intervals of the busy state through the timer 144. Accordingly, the memory system 110 cannot calculate an accurate system time using only the timer 144 if it switches to the hibernation state after it has received time information from the host 102. For example, when the memory system 110 receives time information indicating a specific time, stays in the busy state during a first time interval, switches from the busy state to the hibernation state, and then stays in the hibernation state during a second time interval, a current time may be obtained by adding the specific time, the first time interval, and the second time interval. Thus, assuming that the timer 144 can measure only the first time interval in the busy state, the memory system 110 may not accurately calculate the current time using only the timer 144 without information on the second time interval.

However, a processing burden of the host 102 and the memory system 110 may increase if the host 102 provides an absolute time whenever the memory system 110 switches from the hibernation state to the busy state so that the memory system 110 can calculate an accurate system time. The reason is that the memory system 110 may frequently switch from the hibernation state to the busy state during the operation of the memory system 110.

According to an embodiment of this disclosure, the memory system 110 may receive an absolute time from the host 102 when the power state is changed between the active state and the inactive state. The memory system 110 may calculate a busy elapsed time interval using the timer 144 in the busy state, and may count the number (or a hibernation number) of times that the memory system 110 switches from the busy state to the hibernation state. The memory system 110 may calculate an average hibernation elapsed time interval (or an average hibernation time interval) based on time information including two times or more received from the host 102, the busy elapsed time interval, and the hibernation number. The memory system 110 may calculate a system time more exactly based on an absolute time received from the host 102, a busy elapsed time interval since the absolute time, the hibernation number, and the average hibernation elapsed time.

Requirements for the memory system 110 may define a quality guarantee period. The lifespan of a non-volatile memory device of the memory system 110 may come to an end as a program operation and an erase operation are repeated. If the host 102 does not frequently use the memory system 110, the number of repetitions of a program operation and an erase operation will not significantly increase. Accordingly, if the host 102 does not frequently use the memory system 110, the lifespan of the non-volatile memory device may remain although the guarantee period of the memory system 110 elapses after the use of the memory system 110 is started.

According to an embodiment of this disclosure, the memory system 110 may periodically monitor usage of the non-volatile memory device based on the calculated system time. The memory system 110 may perform an operation for performance improvement of the memory system 110 based on whether usage of the non-volatile memory device in a monitoring elapsed time interval (or a monitoring time interval) from a previous monitoring time to a current monitoring time is equal to or less than a threshold (or a threshold value).

The threshold may be determined based on the monitoring elapsed time interval, the quality guarantee period, and the lifespan of the memory device 150. The operation for performance improvement may be accompanied by a program operation and erase operation of the non-volatile memory device. For example, the memory system 110 may secure an excess memory space by performing a garbage collection operation. If the host 102 does not frequently use the memory system 110, the memory system 110 may further perform a program operation and erase operation for improving performance of the memory system 110 within the limits that the guarantee period can be ensured. Accordingly, the memory system 110 can provide a user with improved performance within the guarantee period.

Figure 2:
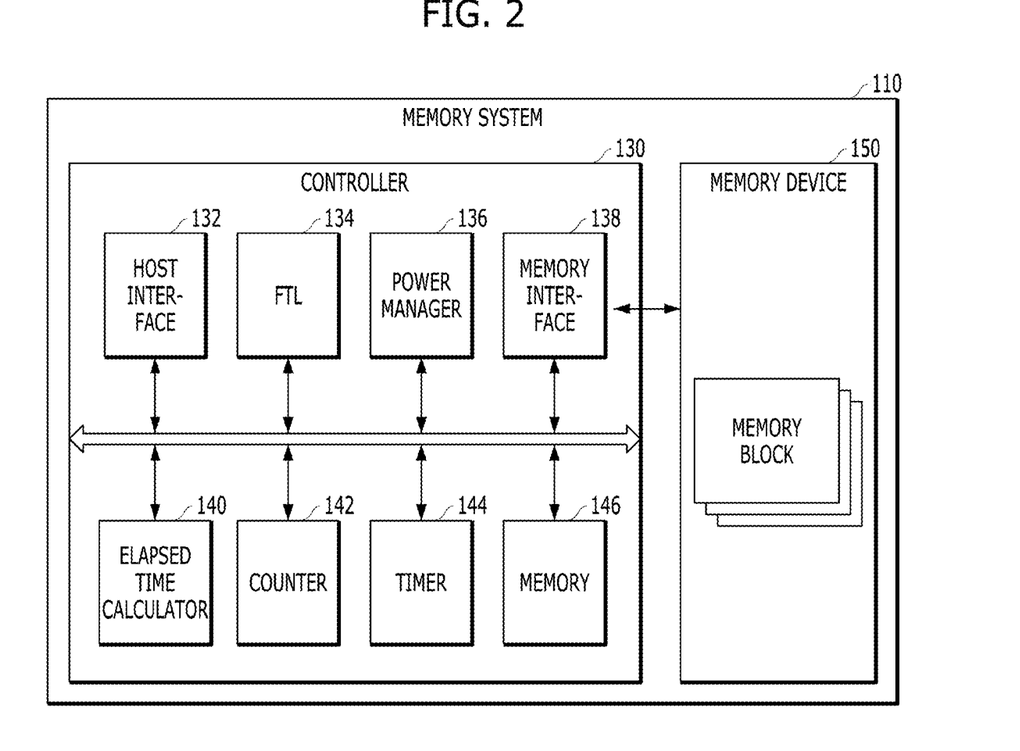
FIG. 2 is a diagram illustrating the structure of a memory system according to an embodiment of this disclosure.

FIG. 2 is a diagram illustrating the structure of the memory system 110 according to an embodiment of this disclosure.

The memory system 110 may include a controller 130 and a memory device 150. The memory device 150 may store data for the host 102, and the controller 130 may control data storage into the memory device 150.

The controller 130 and the memory device 150 may be integrated into a single semiconductor device. For example, the controller 130 and the memory device 150 may be integrated as one semiconductor device to constitute a solid state drive (SSD). When the memory system 110 is used as an SSD, the operating speed of the host 102 connected to the memory system 110 can be improved. In addition, the controller 130 and the memory device 150 may be integrated as one semiconductor device to constitute a memory card. For example, the controller 130 and the memory device 150 may constitute a memory card such as a personal computer memory card international association (PCMCIA) card, compact flash (CF) card, smart media (SM) card, memory stick, multimedia card (MMC) including reduced size MMC (RS-MMC) and micro-MMC, secure digital (SD) card including mini-SD card, micro-SD card and SDHC card, or universal flash storage (UFS) device.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory blocks, each of which may include a plurality of pages, and each of the pages may include a plurality of memory cells coupled to a word line. In an embodiment, the memory device 150 may be a flash memory. The flash memory may have a 3-dimensional (3D) stack structure.

The controller 130 may control the memory device 150 in response to a request from the host 102. For example, the controller 130 may provide data read from the memory device 150 to the host 102, and store data provided from the host 102 into the memory device 150. For this operation, the controller 130 may control read, program, and erase operations of the memory device 150.

The controller 130 may include a host interface 132, a flash translation layer (FTL) 134, a power manager 136, a memory interface 138, an elapsed time calculator 140, a counter 142, the timer 144, and a memory 146, which are operatively connected through an internal bus.

The host I/F 132 may be configured to process a command and data of the host 102, and may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI), and integrated drive electronics (IDE).

The host I/F 132 may be driven through firmware referred to as a host interface layer (HIL) in order to exchange data with the host 102.

The host interface 132 may receive time information from the host 102. In one embodiment, the host interface 132 may receive time information when the power state of the memory system 110 is changed between the active state and the sleep state or between the active state and the power-off state.

The FTL 134 may control an overall operation of the memory system 110. The FTL 134 may be loaded onto the memory 146 and may operate in a processor (not illustrated) within the controller 130.

The FTL 134 may perform a foreground operation corresponding to a request from the host 102. The FTL 134 may map a logical address, which corresponds to a request received from the host interface 132, and a physical address of the memory device 150. The FTL 134 may convert a write request, a read request, and an erase request into a program command, a read command, and an erase command for the memory device 150, respectively. In some implementations, the FTL 134 can maximize a one-shot program, one-shot read performance, or parallel processing performance of the memory interface 142 by aligning the sequence of write commands and providing the write commands to the memory interface 138.

The FTL 134 may perform a background operation. For example, the FTL 134 may collect valid data, move them to an empty block, and erase blocks including the moved valid data by performing a garbage collection so that the memory device 150 can have a sufficient number of empty blocks.

The power manager 136 may control a power supply to the memory system 110 based on a power state of the memory system 110.

The memory I/F 138 may serve as a memory/storage interface for interfacing the controller 130 and the memory device 150 such that the controller 130 controls the memory device 150 in response to a request from the host 102. When the memory device 150 is a flash memory (e.g., a NAND flash memory), the memory I/F 138 may generate a control signal for the memory device 150 and process data to be provided to the memory device 150 under the control of the processor 134. The memory I/F 138 may work as an interface (e.g., a NAND flash interface) for processing a command and data between the controller 130 and the memory device 150. Specifically, the memory I/F 138 may support data transfer between the controller 130 and the memory device 150.

The memory I/F 138 may be driven through firmware referred to as a flash interface layer (FIL) in order to exchange data with the memory device 150.

In an implementation, the memory I/F 138 may include an error correction code (ECC) capable of detecting and correcting an error contained in the data read from the memory device 150. In other words, the ECC may perform an error correction decoding process on the data read from the memory device 150 through an ECC value used during an ECC encoding process. According to a result of the error correction decoding process, the ECC may output a signal, for example, an error correction success/fail signal. When the number of error bits is more than a threshold value of correctable error bits, the ECC may not correct the error bits, and may output an error correction fail signal.

The memory 146 may serve as a working memory of the memory system 110 and the controller 130, and store data for driving the memory system 110 and the controller 130. The controller 130 may control the memory device 150 to perform read, program, and erase operations in response to a request from the host 102. The controller 130 may provide data read from the memory device 150 to the host 102, and may store data provided from the host 102 into the memory device 150. The memory 146 may store data required for the controller 130 and the memory device 150 to perform these operations.

The memory 146 may store an absolute time received from the host 102, a hibernation number counted by the counter 142, and a busy elapsed time interval calculated (e.g., a first busy elapsed time interval B1 in FIG. 3) by the timer 144.

The memory 146 may be embodied by a volatile memory. For example, the memory 146 may be embodied by static random access memory (SRAM) or dynamic random access memory (DRAM). The memory 146 may be disposed within or outside the controller 130. Although the embodiment shown in FIG. 2 includes the memory 146 disposed within the controller 130, embodiments of the present disclosure are not limited thereto. In an embodiment, the memory 146 may be embodied by an external volatile memory having a memory interface transferring data between the memory 146 and the controller 130.

The timer 144 may operate in the busy state of the memory system 110 and measure a busy elapsed time interval.

The counter 142 may count the hibernation number of the memory system 110.

The elapsed time calculator 140 may calculate the system time of the memory system 110 based on an average hibernation elapsed time interval between two or more absolute times received from the host 102, the busy elapsed time interval of the memory system 110 from an absolute time received from the host 102, and a hibernation number, as will be described below in more detail with reference to FIG. 3.

Figure 3:
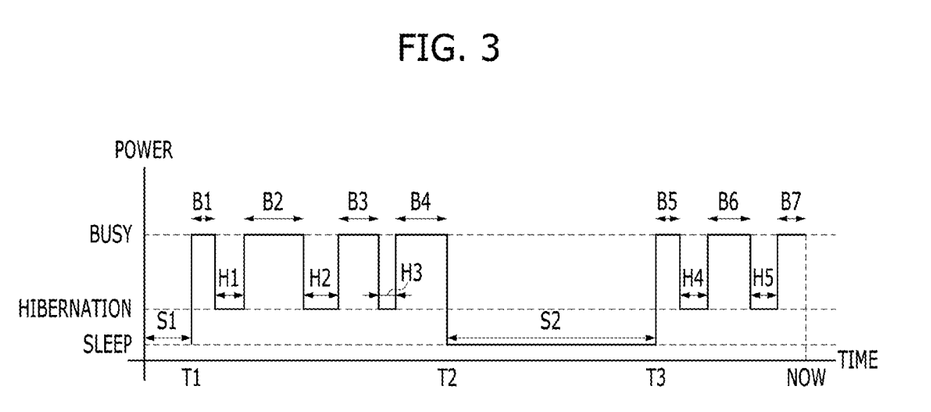
FIG. 3 is a diagram for illustrating a method of estimating, by an elapsed time calculator, a current time of a memory system according to an embodiment of this disclosure.

FIG. 3 is a diagram for illustrating a method of calculating a system time of the memory system 110 by the elapsed time calculator 140, according to an embodiment.

In the graph of FIG. 3, a horizontal axis indicates an elapsed time (TIME), and a vertical axis indicates power (POWER). A solid line illustrated in FIG. 3 indicates a power supply to the memory system 110 according to the elapsed time.

Power in the busy state, the hibernation state, and the sleep state is illustrated in the vertical axis of the graph of FIG. 3. For example, the inactive state includes the sleep state and a power-off state.

First to third times T1 to T3 and a current time NOW are illustrated in the horizontal axis of the graph of FIG. 3. The first to third times T1 to T3 indicate absolute times received by the host interface 132 from the host 102. First to seventh busy elapsed time intervals B1 to B7, first to fifth hibernation elapsed time intervals H1 to H5, and first and second sleep elapsed time intervals S1 and S2 are illustrated in the graph of FIG. 3.

Referring to FIG. 3, the host interface 132 may receive an absolute time from the host 102 when the memory system 110 switches from the active state to the inactive state or switches from the inactive state to the active state.

In some implementations, the host interface 132 may receive time information provided by the host 102 along with a sleep request, a sleep release request, a power-off request, or a power-on request. In some implementations, the host interface 132 may provide a time information request signal while providing a response according to a sleep request, a sleep release request, a power-off request, or a power-on request from the host 102. The host interface 132 may receive time information provided by the host 102 in response to the time information request signal.

In the example of FIG. 3, at the first time T1, the memory system 110 may switch from the sleep state to the active state. The host interface 132 may obtain time information of the first time T1 from the host 102. The memory 146 may store the time information.

During the first to fourth busy elapsed time intervals (or first to fourth busy time intervals) B1 to B4, the timer 144 may measure each of the busy elapsed time intervals B1 to B4 while in operation. During the first to third hibernation elapsed time intervals (or first to third hibernation time intervals) H1 to H3, the timer 144 may not operate. The counter 142 may count a hibernation number that the memory system 110 switches from the busy state to the hibernation state. For example, during a time interval (or a first active state time interval) between the first time T1 and a second time T2, the memory system 110 transitions from the busy state to the hibernation state three times, and thus the hibernation number is equal to three.

The memory 146 may store the busy elapsed time intervals B1 to B4 and the hibernation number.

At the second time T2, the memory system 110 may switch from the active state to the sleep state. The host interface 132 may obtain time information of the second time from the host 102. In some implementations, the FTL 134 may control the memory device 150 to perform program operations to store the busy elapsed time intervals B1 to B4 and the hibernation number and the first and second times T1 and T2 received from the host 102.

At a third time T3, the memory system 110 may switch from the sleep state to the active state. The host interface 132 may obtain the third time T3, that is, an absolute time, from the host 102. The memory 146 may store the absolute time.

In some implementations, the FTL 134 may load the first and second times T1 and T2, the busy elapsed time intervals B1 to B4, and the hibernation number, which are programmed into the memory device 150, onto the memory 146 through the memory interface 138.

The elapsed time calculator 140 may calculate an average hibernation elapsed time interval (or an average hibernation time interval) based on the first and second times T1 and T2, the busy elapsed time intervals B1 to B4, and the hibernation number.

In the example of FIG. 3, the elapsed time calculator 140 may calculate the sum (or a total hibernation time interval) of the first to third hibernation elapsed time intervals H1 to H3 by subtracting the sum of the first to fourth busy elapsed time intervals (or the first to fourth busy time intervals) B1 to B4 from an elapsed time interval (or a first active state time interval) between the first and second times T1 and T2. That is, although each of the first to third hibernation elapsed times H1 to H3 cannot be individually measured because the timer 144 does not operate in the hibernation state, the elapsed time calculator 140 can calculate a total hibernation time interval (i.e., the sum of the first to third hibernation elapsed time intervals H1 to H3) in the first active state time interval between the first and second times T1 and T2. In the example of FIG. 3, a total hibernation number (or a hibernation number) having occurred between the first and second times T1 and T2 is 3. The elapsed time calculator 140 may calculate an average hibernation elapsed time interval (or an average hibernation time interval) by dividing the hibernation elapsed time interval between the first and second times T1 and T2 by the hibernation number.

The elapsed time calculator 140 may calculate a system time based on an absolute time received from the host 102, one or more busy elapsed time intervals since the absolute time, a hibernation number, and an average hibernation elapsed time interval between the first and second times T1 and T2. For example, the elapsed time calculator 140 may calculate a system time NOW based on a third time T3 received from the host 102 after the second time T2, fifth to seventh busy elapsed time intervals B5 to B7 after the third time T3, a hibernation number since the third time T3, and the average hibernation elapsed time interval in the first active state time interval between the first and second times T1 and T2.

A method of calculating, by the elapsed time calculator 140, the present system time NOW is described with reference to FIG. 3. The timer 144 may operate in the fifth to seventh busy elapsed time intervals B5 to B7 from the third time T3 to the present time NOW, and may measure each of the busy elapsed time intervals B5 to B7. The timer 144 may not operate in the fourth and fifth hibernation elapsed time intervals H4 and H5. The counter 142 may count a hibernation number from the third time T3 to the present time NOW. In the example of FIG. 3, the hibernation number since the third time T3 is 2.

The present system time NOW may be calculated as the sum of the third time T3, the fifth and sixth busy elapsed time intervals B5 and B6, and the fourth and fifth hibernation elapsed time intervals H4 and H5. The elapsed time calculator 140 may calculate the present system time NOW by considering the average hibernation elapsed time interval between the first and second times T1 and T2 as each of the fourth and fifth hibernation elapsed time intervals H4 and H5. Specifically, the elapsed time calculator 140 may assume that each of the fourth and fifth hibernation elapsed time intervals H4 and H5 has the same duration as that of the average hibernation elapsed time interval between the first and second times T1 and T2 to calculate the present system time NOW.

That is, a system time may be calculated by adding a total busy elapsed time interval (or total busy time interval) and a total hibernation elapsed time interval (or total hibernation time interval) since an absolute time to the absolute time, the absolute time being received from the host 102. In this case, the total hibernation elapsed time interval may be calculated as the product of a hibernation number since the absolute time and the average hibernation elapsed time interval between the first and second times T1 and T2. For example, the present system time NOW in FIG. 3 may be calculated by adding the total busy elapsed time interval (i.e. the sum of the fifth, sixth, and seventh busy elapsed time intervals B5, B6, and B7) and the total hibernation elapsed time interval (i.e., the sum of the fourth and fifth hibernation elapsed time intervals H4 and H5) to the third time T3, where the total hibernation elapsed time interval may be calculated as the product of the hibernation number (i.e., 2) after the third time T3 and the average hibernation elapsed time interval between the first and second times T1 and T2. In the embodiment shown in FIG. 3, the average hibernation elapsed time interval is calculated during a single active state time interval (e.g., the first active state time interval between the first and second times T1 and T2) before a specific system time (e.g., the present system time NOW), but embodiments of the present disclosure are not limited thereto. For example, a plurality of average hibernation elapsed time intervals may be calculated during a plurality of active state time intervals before the specific system time, respectively, the calculated plurality of average hibernation elapsed time intervals may be averaged again to obtain an overall average hibernation elapsed time interval, and then the overall average hibernation elapsed time interval may be used to calculate the specific system time.

According to an embodiment of this disclosure, although the timer 144 does not operate in the hibernation state and the memory system 110 does not receive an absolute time from the host 102 when the memory system 110 switches between the active state and the hibernation state, the memory system 110 may calculate a system time based on an average hibernation elapsed time interval and a hibernation number. The memory system 110 may monitor usage of the memory device 150 at given time intervals based on the system time. The memory system 110 may perform an additional program and erase operation for performance improvement of the memory system 110 provided that the guarantee period of the memory system 110 is ensured based on the monitored usage of the memory device 150.

Figure 4:
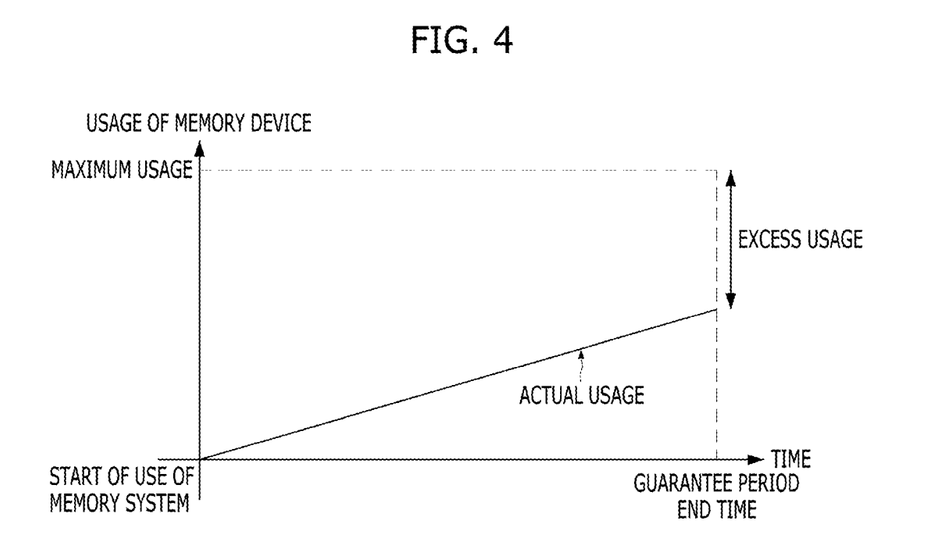
FIG. 4 is a graph for illustrating a guarantee period of a memory system and usage of a memory device according to an embodiment of this disclosure.

FIG. 4 is a graph for illustrating the guarantee period of the memory system 110 and usage of the memory device 150.

In the graph of FIG. 4, a horizontal axis indicates time, and a vertical axis indicates usage of the memory device 150. The use start time (referred to as "START OF USE OF MEMORY SYSTEM" in FIG. 4) and guarantee period end time of the memory system 110 are illustrated in the horizontal axis of the graph. The use start time may indicate a time when the memory system 110 is first connected to a computing system, such as the host 102, and used. The guarantee period end time may indicate a time when an elapsed time interval since the use start time has reached a guarantee period. Maximum usage of the memory device 150 is illustrated in the vertical axis of the graph.

Due to the properties of memory cell elements included in the memory device 150, the number of repetitions of a program operation and erase operation (hereinafter, referred to as a "P/E cycle" number) of the memory device 150 may be limited. Maximum memory block usage of a corresponding memory device 150 may be determined based on the number of memory blocks and maximum P/E cycle number of the memory device 150. Specifically, maximum usage of the memory device 150 may be calculated by multiplying the capacity of the memory device 150 and the maximum P/E cycle number. For example, if a maximum P/E cycle number of the memory device 150 is 1,000 and the capacity of the memory device 150 is 128 GB, the lifespan of the memory device 150 may come to an end after data of about 128 TB have been written.

The user of the host 102 may not store a large amount of data, corresponding to the maximum usage of the memory system 110, within the guarantee period of the memory system 110. In the graph of FIG. 4, a solid line indicates actual usage of the memory system 110. FIG. 4 illustrates a case where the actual usage of the memory system 110 at the end of the guarantee period does not reach the maximum usage.

According to an embodiment of this disclosure, the memory system 110 may be use excess usage, corresponding to a difference between the maximum usage and actual usage of the memory device 150, to improve performance of the memory system 110.

Figure 5:
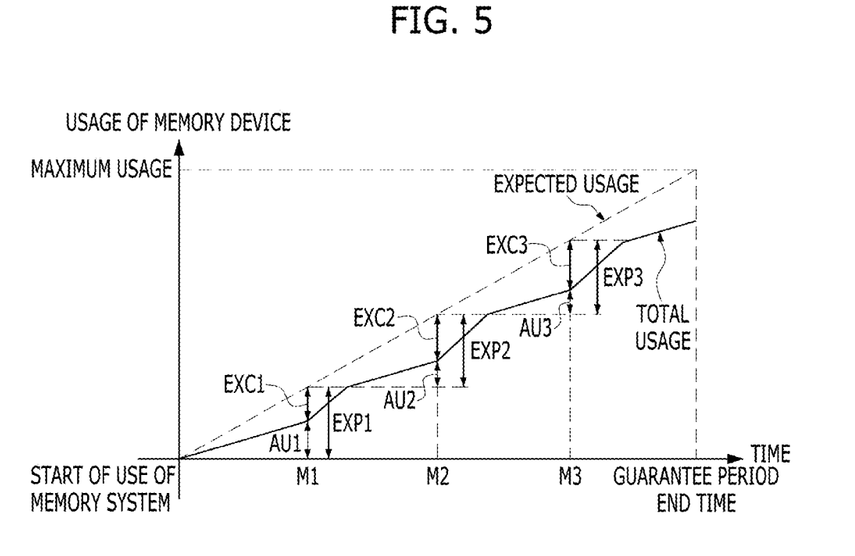
FIG. 5 is a graph for illustrating an operation of a memory system according to an embodiment of this disclosure.

FIG. 5 is a graph for illustrating an operation of the memory system 110 according to an embodiment of this disclosure.

In the graph of FIG. 5, a horizontal axis indicates time, and a vertical axis indicates usage of the memory device 150. The use start time (referred to as "START OF USE OF MEMORY SYSTEM" in FIG. 5) and guarantee period end time of the memory system 110 are illustrated in the horizontal axis of the graph. Maximum usage of the memory device 150 is illustrated in the vertical axis of the graph. Expected usage, actual usage during monitoring elapsed time intervals (or monitoring time intervals), excess usage at each of monitoring times, and total usage are illustrated in the graph.

The expected usage of the memory device 150 according to an elapsed time interval may be determined based on the maximum usage and guarantee period described with reference to FIG. 4. The expected usage may be determined by multiplying a value, obtained by dividing the maximum usage by the guarantee period, and an elapsed time interval. For example, if maximum usage of the memory device 150 is 128 TB and a guarantee period is 5 years, the guarantee period will be satisfied if data of 25.6 TB or less is programmed into the memory device 150 for one year. Expected usage for 1 year may be determined by dividing 128 TB, that is, the maximum usage, by 5 years that is the guarantee period, and multiplying the divided value and 1 year, that is, an elapsed time interval.

The memory system 110 may monitor actual usage of the memory device 150 at given intervals. If actual usage during a monitoring elapsed time interval from a previous monitoring time to a current monitoring time does not reach expected usage during the monitoring elapsed time interval, the memory system 110 may perform one or more operations for improving performance of the memory system 110 until total usage of the memory device 150 reaches the expected usage.

For example, the memory system 110 may monitor actual usage of the memory device 150 for a recent 1 day at one-day intervals after the memory system 110 is connected to the host 102 and used. If the actual usage of the memory device 150 for 1 day does not reach expected usage for 1 day, the memory system 110 may perform one or more additional program and erase operations for improving performance of the memory system 110.

First to third monitoring times M1 to M3 when the memory system 110 monitors the actual usage are illustrated in the horizontal axis of the graph of FIG. 5.

Referring to FIG. 5, at the first monitoring time M1, the memory system 110 may calculate first actual usage AU1 during a first monitoring elapsed time interval (or a first monitoring time interval) from the use start time of the memory system 110 to the first monitoring time M1.

In one embodiment, the memory system 110 may store a P/E cycle number for each block of the memory device 150. The memory system 110 may calculate the first actual usage AU1 of the memory device 150 based on a change in a total P/E cycle number during the first monitoring elapsed time interval.

In one embodiment, the memory system 110 may calculate the first actual usage AU1 of the memory device 150 based on the amount of data received from the host 102 during the first monitoring elapsed time interval.

At the first monitoring time M1, the first actual usage AU1 may not reach first expected usage EXP1. For example, the first expected usage EXP1 may be calculated by multiplying a slope of the expected usage line EXPECTED USAGE with a duration of the first monitoring time interval. The memory system 110 may determine a difference between the first expected usage EXP1 and the first actual usage AU1 at the first monitoring time M1 as first excess usage EXC1, and may consume the first excess usage EXC1 by performing one or more operations for improving performance. The memory system 110 may perform these additional operations for performance improvement until it fully consumes the first excess usage EXC1 after the first monitoring time M1. For example, the memory system 110 may perform additional operations for performance improvement during a first portion of a second monitoring time interval between the first monitoring time M1 and the second monitoring time M2. When the first excess usage EXC1 is fully consumed, the memory system 110 may not perform an additional operation for performance improvement.

At the second monitoring time M2, the memory system 110 may calculate second actual usage AU2 during a second portion of the second monitoring elapsed time interval (or second monitoring time interval) from the first monitoring time M1 to the second monitoring time M2, the second portion being subsequent to the first portion of the second monitoring time interval. In one embodiment, the memory system 110 may calculate the second actual usage AU2 by subtracting the first excess usage EXC1, determined at the first monitoring time M1, from actual usage during the second monitoring elapsed time interval. For example, the actual usage during the entire second monitoring elapsed time interval may be a difference between a first value of a total usage line TOTAL USAGE at the second monitoring time M2 and a second value of the total usage line TOTAL USAGE at the first monitoring time M1. The actual usage during the second monitoring elapsed time interval may be calculated based on a change in the P/E cycle number of the memory device 150 or the amount of data received from the host 102. The memory system 110 may calculate second expected usage EXP2 during the second monitoring elapsed time interval, may determine second excess usage EXC2 based on the second actual usage AU2 and the second expected usage EXP2 during the second monitoring elapsed time, and may perform one or more additional operations until it fully consumes the second excess usage EXP2. For example, the memory system 110 may determine the second excess usage EXC2 by subtracting the second actual usage AU2 from the second expected usage EXP2, and may perform these additional operations during a first portion of a third monitoring time interval between the second monitoring time M2 and a third monitoring time M3.

Likewise, at the third monitoring time M3, the memory system 110 may calculate third actual usage AU3 during a second portion of the third monitoring elapsed time interval, may determine third excess usage EXC3 by subtracting the third actual usage AU3 from third expected usage EXP3 during the third monitoring elapsed time interval, and may perform one or more additional operations until it fully consumes the third excess usage EXC3.

The memory system 110 may monitor actual usage at given intervals based on a system time (e.g., the present system time NOW in FIG. 3) calculated using the elapsed time calculator 140 described with reference to FIGS. 1 to 3. The memory system 110 can monitor actual usage at accurate intervals, determine excess usage, and perform one or more additional operations for improving performance by calculating a system time although it does not receive an absolute time from the host 102 in the hibernation state.

In one embodiment, if excess usage of the memory device 150 is present, the memory system 110 can sufficiently secure the free block of the memory device 150 by performing an additional garbage collection operation until the memory system 110 fully consumes the excess usage. For example, the memory system 110 may keep the number of free blocks of the memory device 150 equal to or greater than a given number by performing an additional garbage collection operation while the memory system 110 consumes the excess usage.

In one embodiment, if excess usage is present, the memory system 110 may program data into the memory device 150 in a single level cell (SLC) mode while consuming the excess usage, and then may program the data, programmed in the SLC mode, in a multi-level cell (MLC) mode after a given elapsed time interval. The memory system 110 can improve program performance by programming data in an SLC mode, and can also improve read performance by keeping the data programmed in the SLC mode until the data is programmed again in an MLC mode.

Referring to FIG. 5, the memory system 110 may determine whether excess usage is present at given intervals, and may consume total usage close to expected usage of the memory device 150 up to a guarantee period end time by performing one or more additional operations until the memory system fully consumes the excess usage if the excess usage is present. The memory system 110 can provide the memory system 110 having high performance to a user by consuming excess usage while satisfying a given guarantee period from the use start time of the memory system 110.

Figure 6A:
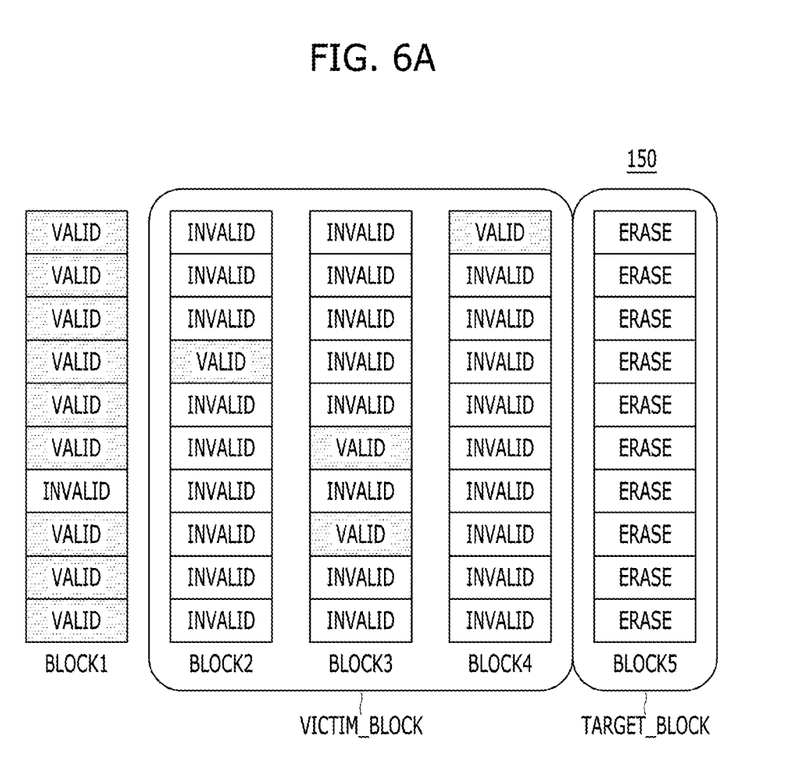
FIGS. 6a and 6b are diagrams for illustrating a garbage collection operation.
Figure 6B:
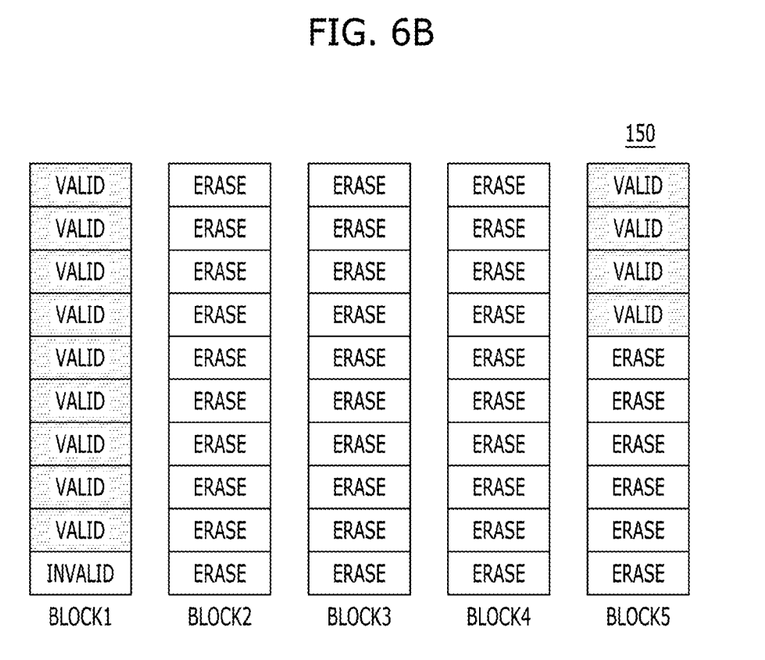

FIGS. 6A and 6B are diagrams for illustrating a garbage collection operation.

FIGS. 6A and 6B each illustrate a memory device 150 including five memory blocks BLOCK1 to BLOCK 5.

Each of the memory blocks BLOCK1 to BLOCK 5 may include memory cells connected to a plurality of word lines. Assuming that memory cells connected to one word line are called a page, each of the memory blocks BLOCK1 to BLOCK 5 may include a plurality of pages. Each of the memory blocks BLOCK1 to BLOCK 5 illustrated in FIGS. 6a and 6b may include 10 pages.

The memory device 150 applies a voltage to a word line in order to perform a write operation. That is, a minimum unit of the write operation of the memory device 150 may correspond to memory cells connected to a single word line, that is, one page unit.

The memory device 150 may remove charges trapped at the memory cells of a memory block by applying a voltage to all the word lines of the memory block in order to perform an erase operation. That is, a minimum unit of the erase operation of the memory device 150 may be one memory block unit.

The unit of the write operation and the unit of the erase operation of the memory device 150 may be different. The memory device 150 does not support an overwrite operation. Accordingly, a controller controls the memory device 150 to write data, which is stored in a specific page and to be updated, in another page in order to update the data, and invalidates the data stored in the specific page.

In FIGS. 6A and 6B, a valid page in which valid data is stored is labeled as "VALID", an invalid page in which invalid data is stored is labeled as "INVALID", and an erase page is labeled as "ERASE." A fifth memory block BLOCK5, that is, a memory block whose pages are all erase pages, is a free block. If the number of invalid pages within the memory device 150 increases, a memory space capable of storing data may become insufficient. In the example of FIG. 6A, 26% of the memory region of the memory device 150 includes valid data, but a memory region in which data can be stored is only 20%.

A series of operations of controlling, by the controller, the memory device 150 to program the valid data of one or more victim blocks (e.g., victim blocks VICTIM_BLOCK in FIG. 6A) into a target block (e.g., a target block TARGET_BLOCK in FIG. 6A) and controlling, by the controller, the memory device 150 to perform an erase operation on each of the victim blocks in order to erase invalid data stored in the victim blocks is called a garbage collection (GC) operation. In FIG. 6A, second to fourth memory blocks BLOCK2 to BLOCK4 having a small number of valid pages may be determined as victim blocks VICTIM_BLOCK, and the fifth memory block BLOCK5, that is, a free block, may be determined as a target block TARGET_BLOCK.

FIG. 6B illustrates a case where the memory device 150 of FIG. 6a has performed a GC operation. Three free blocks may be generated by copying the valid data of the victim blocks VICTIM_BLOCK to the target block TARGET_BLOCK and erasing the victim blocks VICTIM_BLOCK. The memory system 110 can secure the memory space of the memory device 150 in which data can be stored by performing the GC operation. For example, the memory system 110 can have an increased number of free blocks by performing the GC operation, thereby securing the memory space.

The GC operation is an operation essential to secure the memory space of the memory device 150. However, the lifespan of the memory device 150 may be reduced if a GC operation is frequently performed because the GC operation includes a program operation and erase operation for the memory block. The memory system 110 may perform a GC operation if the number of free blocks of the memory device 150 is less than a threshold.

In one embodiment, if excess usage of the memory device 150 is present, the FTL 134 may increase a free block number threshold for performing a GC operation until the excess usage is fully consumed.

Figure 7:
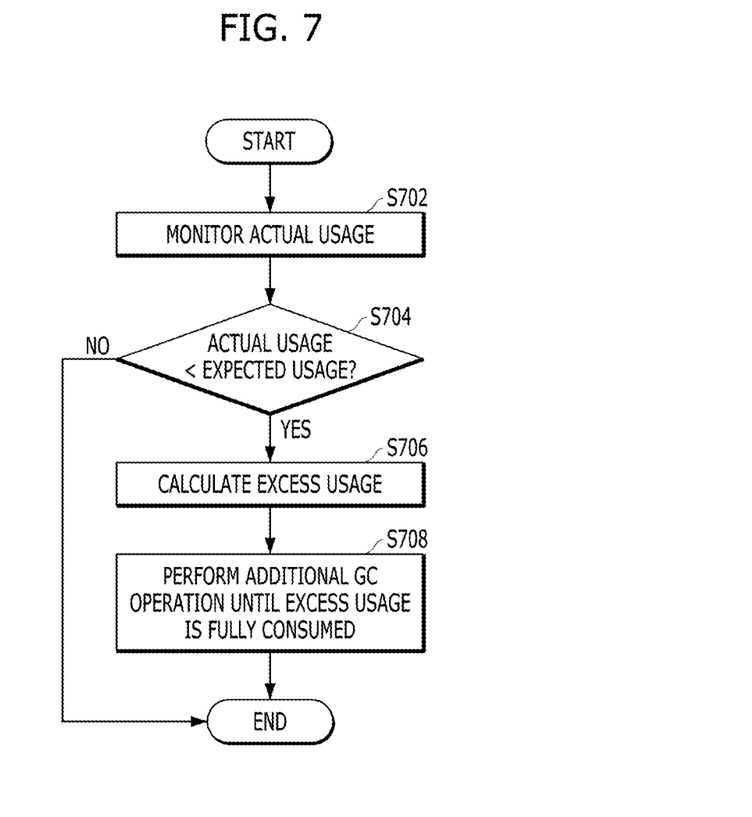
FIG. 7 is a flowchart illustrating an operation of a memory system according to an embodiment of this disclosure.

FIG. 7 is a flowchart illustrating an operation of the memory system 110 according to an embodiment of this disclosure.

At step S702, the FTL 134 may monitor actual usage of the memory device 150 at given intervals.

For example, the FTL 134 may obtain a system time from the elapsed time calculator 140. The FTL 134 may monitor the actual usage when a monitoring elapsed time interval of the memory system 110 reaches a given interval based on the system time. For example, the given interval may be a 1-day interval.

For example, the FTL 134 may calculate actual usage of the memory device 150 based on the P/E cycle number of each of the memory blocks of the memory device 150. The P/E cycle number of each of the memory blocks may be updated whenever the memory block is erased and stored in the memory 146 or the memory device 150.

At step S704, the FTL 134 may compare the monitored actual usage with expected usage. The expected usage may be determined based on the guarantee lifespan of the memory system 110, maximum usage of the memory device 150, and a monitoring elapsed time interval of the memory system 110.

If the actual usage is equal to or greater than the expected usage ("NO" at step S704), the FTL 134 terminates the operation.

If the actual usage is smaller than the expected usage ("YES" at step S704), the FTL 134 may calculate excess usage at step S706. The excess usage may be calculated as a difference between the expected usage and the actual usage.

At step S708, the FTL 134 may perform an additional GC operation until the excess usage is fully consumed. For example, the FTL 134 may increase a free block number threshold for performing the GC operation of the memory device 150. If the free block number threshold increases, an additional GC operation may be performed although the number of free blocks is sufficiently large to operate the memory device 150 normally. The FTL 134 may perform the additional GC operation while consuming the excess usage by increasing the free block number threshold. The FTL 134 can sufficiently secure the excess space of the memory device 150 by performing the additional GC operation. The FTL 134 may decrease the increased free block number threshold if the excess usage is fully consumed by monitoring actual usage of the memory device 150.

Figure 8A:
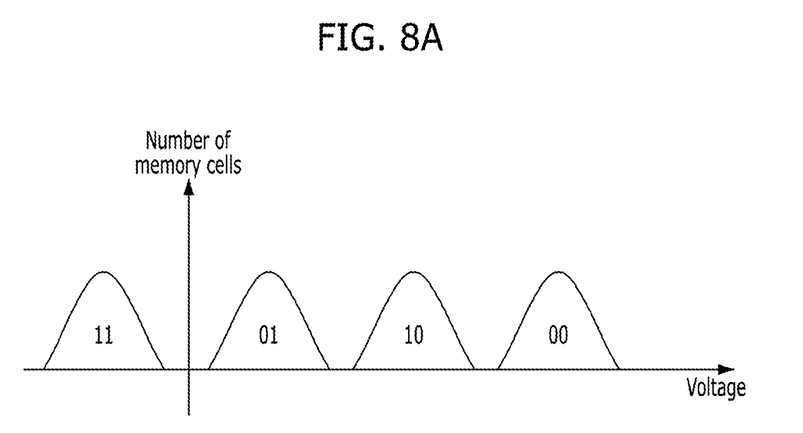
FIGS. 8a and 8b are diagrams illustrating a threshold voltage distribution of memory cells included in a memory device.
Figure 8B:
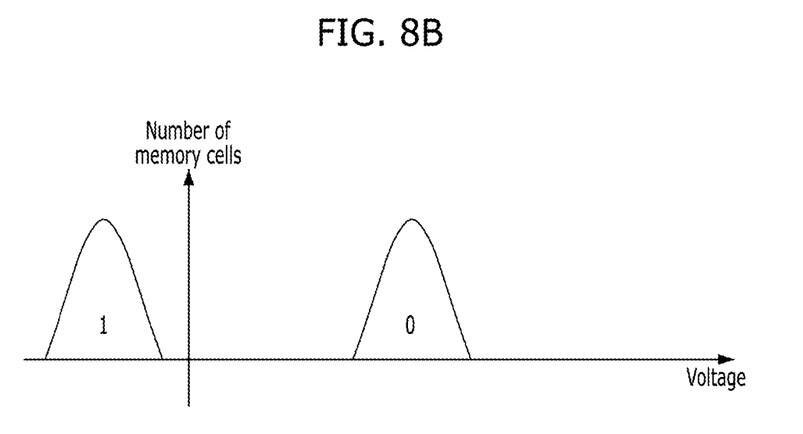

FIGS. 8A and 8B are diagrams each illustrating a threshold voltage distribution of memory cells included in the memory device 150.

In some implementations, the memory device 150 may be a flash memory, for example, a non-volatile memory such as a NAND flash memory. However, the memory device 150 may be implemented as any one of memories, such as a phase change random access memory (PCRAM), a resistive random access memory ((ReRAM)RRAM), a ferroelectrics random access memory (FRAM), and a spin transfer torque magnetic random access memory ((STT-MRAM)STT-RAM). The memory device 150 may include a plurality of memory blocks including an MLC memory block in which data of two bits or more can be stored in a single memory cell. A multi-level cell programmed in an MLC mode may store data of two bits or more. A multi-level cell programmed in an SLC mode may store data of one bit.

FIG. 8A is a graph illustrating threshold voltage distributions of memory cells programmed in an MLC mode.

In the graph of FIG. 8A, a horizontal axis indicates a threshold voltage, and a vertical axis indicates the number of memory cells having corresponding threshold voltages.

In the example of FIG. 8a, the memory cells may be programmed in an MLC mode so that they have any one of four states 11, 01, 10, and 00 depending on a threshold voltage distribution. For example, memory cells having the state "11," that is, an erase state, may be first programmed to have the state "11" or the state "10." Memory cells that belong to the first programmed memory cells and that have the state "11" may be second programmed to have the state "11" or the state "01." The memory cells having the state "10" may be third programmed to have the state "10" or the state "00." The threshold voltage distributions indicated by solid lines in FIG. 8A indicate threshold voltage distributions if memory cells have been ideally programmed.

FIG. 8B is a graph illustrating threshold voltage distributions of memory cells programmed in an SLC mode.

In the graph of FIG. 8B, a horizontal axis indicates a threshold voltage, and a vertical axis indicates the number of memory cells having corresponding threshold voltages.

Referring to FIG. 8B, the memory cells may be programmed in an SLC mode so that they have any one of two states "1" and "0" depending on a threshold voltage distribution. For example, memory cells having the state "1," that is, an erase state, may be programmed to the state "1" or the state "0." The threshold voltage distributions indicated by solid lines in FIG. 8a illustrate threshold voltage distributions if the memory cells have been ideally programmed.

If the memory device 150 programs memory cells in an MLC mode, the capacity of storage per area of a memory chip may be increased. In contrast, if the memory device 150 programs memory cells in an MLC mode, a larger number of program voltages may have to be applied to a word line for programming memory cells compared to when these memory cells are programmed in an SLC mode. Furthermore, when the memory device 150 performs a read operation of data programmed in an MLC mode, the memory device 150 has to apply a larger number of read voltages to a word line to distinguish between threshold voltage states of the programmed memory cells compared to when the memory device 150 performs a read operation of data programmed in an SLC mode. Accordingly, if the memory device 150 programs memory cells in an SLC mode, access performance of the memory device 150 may be increased.

In one embodiment, the FTL 134 may program data in an SLC mode until excess usage is fully consumed if the excess usage of the memory device 150 is present. The FTL 134 may program the data in an MLC mode after a given elapsed time interval from the programming of the data, and may erase the data programmed in the single level cell mode.

Figure 9:
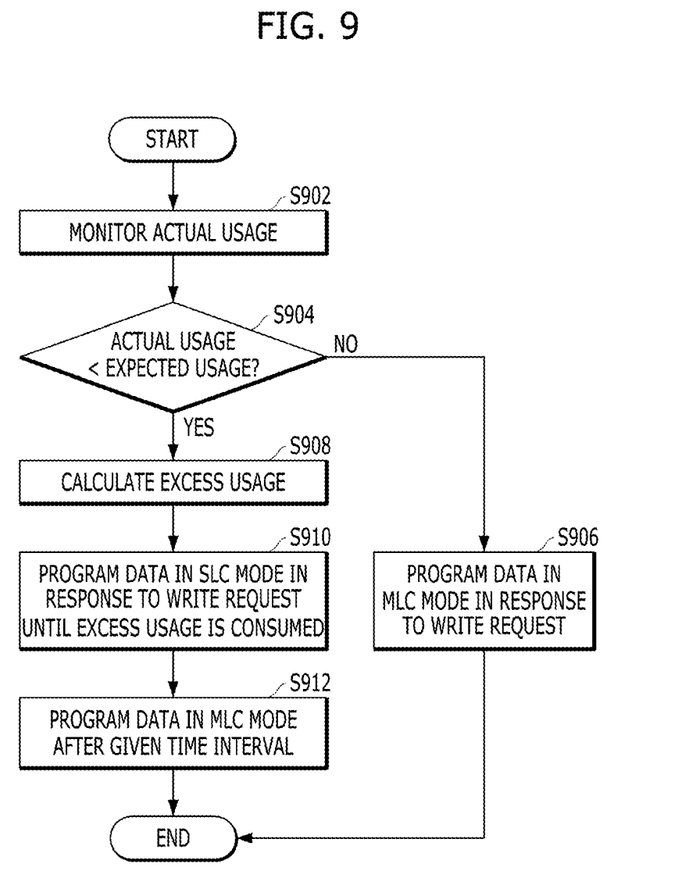
FIG. 9 is a flowchart illustrating an operation of a memory system according to an embodiment of this disclosure.

FIG. 9 is a flowchart illustrating an operation of the memory system 110 according to an embodiment of this disclosure.

At step S902, the FTL 134 may monitor actual usage of the memory device 150 at given intervals. The operation at step S902 corresponds to the operation at step S702.

At step S904, the FTL 134 may compare the monitored actual usage with expected usage. The expected usage may be determined based on the guarantee lifespan of the memory system 110, maximum usage of the memory device 150, and an monitoring elapsed time interval of the memory system 110.

If the actual usage is equal to or greater than the expected usage ("NO" at step S904), at step S906, the FTL 134 may control the memory device 150 to program data in an MLC mode in response to a write request.

If the actual usage is smaller than the expected usage ("YES" at step S904), the FTL 134 may calculate excess usage at step S908.

At step S910, the FTL 134 may control the memory device 150 to program data in an SLC mode in response to a write request until the excess usage is fully consumed. The write request may include a user data write request received from the host 102. In some implementations, the FTL 134 may store the program operation execution time (or program operation time) of the data in the memory 146 based on a system time from the elapsed time calculator 140.

If the memory device 150 programs the same amount of data in an SLC mode, memory usage may be increased compared to when the data is programmed in an MLC mode. In contrast, if the memory device 150 programs data in an SLC mode, performance of a program operation can be enhanced. Furthermore, if the memory device 150 reads data programmed in an SLC mode, performance of a read operation can be enhanced. The FTL 134 can improve access performance of the memory device 150 while ensuring the guarantee period of the memory system 110 by controlling the memory device 150 to program data in an SLC mode until excess usage is fully consumed.

After a given elapsed time interval (or a given time interval) elapses from a program operation time when the programming of the data is performed, at step S912, the FTL 134 may control the memory device 150 to program the data in an MLC mode and to erase the data programmed in an SLC mode. Step S912 may be performed as a background operation. The FTL 134 may determine whether such a given time interval has elapsed based on a present system time calculated from the elapsed time calculator 140 and the program operation time stored in the memory 146.

According to an embodiment of this disclosure, the elapsed time calculator 140 of the memory system 110 can calculate a system time although the timer 144 does not operate in the hibernation state and the memory system 110 does not receive an absolute time from the host 102 when it switches from the hibernation state to the busy state. The elapsed time calculator 140 may calculate a system time based on an average hibernation elapsed time interval, a busy elapsed time interval since a recently received absolute time, and a hibernation number after the recently received absolute time. Accordingly, the elapsed time calculator 140 may accurately calculate a system time without receiving one or more absolute times from the host 102 when the memory system 110 switches from the hibernation state to the busy state.

The FTL 134 may calculate excess usage of the memory device 150 at given intervals based on the system time. Although a program operation and erase operation are performed on the memory device 150 to consume the excess usage, the lifespan of the memory device 150 can be guaranteed up to the guarantee period of the memory system 110. The FTL 134 can improve performance of the memory device 150 by performing one or more additional operations until the excess usage is fully consumed. For example, these additional operations may include an additional GC operation, or an operation of programming data in an SLC mode, or both. According to an embodiment of this disclosure, the memory system 110 can provide a user with improved performance while ensuring a guarantee period.

This disclosure is to provide the memory system having improved reliability and the operating methods thereof by operating based on an estimated current time.

Although the detailed embodiments have been described in the detailed description of the disclosure, the disclosure may be modified in various ways without departing from the scope of the disclosure. Accordingly, the scope of the disclosure should not be limited to the above-described embodiments, but should be defined by not only the claims, but equivalents thereof.

What is claimed is:

1. A controller controlling a memory device, the controller comprising:
    an elapsed time calculator suitable for receiving a plurality of absolute times from a host when a state of a memory system including the memory device is changed between an active state and an inactive state, the plurality of absolute times including first, second, and third absolute times, calculating an average hibernation time interval in an active state time interval between the first and second absolute times, and calculating a system time based on the third absolute time and the average hibernation time interval; and
    a flash translation layer (FTL) suitable for calculating expected usage of the memory device during a monitoring time interval based on the system time, calculating excess usage based on actual usage of the memory device during the monitoring time interval and the expected usage, and controlling the memory device to program data in a single level cell mode until the excess usage is fully consumed.

2. The controller of claim 1, further comprising a memory suitable for storing a program operation time based on the system time, the data being programmed at the program operation time.

3. The controller of claim 2, wherein the FTL controls the memory device to program the data in a multi-level cell mode after a given time interval from the program operation time of the data.

4. The controller of claim 1, wherein the FTL controls the memory device to program data in a multi-level cell mode after the excess usage is fully consumed.

5. The controller of claim 1, wherein the elapsed time calculator calculates a total hibernation time interval between the first and second absolute times based on the active state time interval between the first and second absolute times and one or more busy time intervals between the first and second absolute times, and calculates the average hibernation time interval based on the total hibernation time interval and a hibernation number between the first and second absolute times.

6. The controller of claim 5, further comprising:
a timer suitable for measuring the busy time intervals; and
a counter suitable for counting the hibernation number.

7. The controller of claim 1, wherein the elapsed time calculator calculates a total hibernation time interval after the third absolute time based on a hibernation number after the third absolute time and the average hibernation time interval in the active state time interval between the first and second absolute times, the third absolute time being subsequent to the active state time interval, and calculates the system time based on one or more busy time intervals after the third absolute time and the total hibernation time interval after the third absolute time.

8. The controller of claim 1, wherein the FTL updates a program/erase (P/E) cycle number that indicates repetitions of a program operation and erase operation performed on one or more memory blocks included in the memory device, and calculates the actual usage based on the P/E cycle number.

9. The controller of claim 1, wherein the FTL calculates the expected usage based on maximum usage, a guarantee period of the memory system, and the monitoring time interval, the maximum usage being determined based on a capacity and a lifespan of the memory device.

10. The controller of claim 1, wherein the inactive state comprises a sleep state and a power-off state.

11. A controller controlling a memory device, the controller comprising:
an elapsed time calculator suitable for receiving a plurality of absolute times from a host when a state of a memory system including the memory device is changed between an active state and an inactive state, the plurality of absolute times including first, second, and third absolute times, calculating an average hibernation time interval in an active state time interval between the first and second absolute times, and calculating a system time based on the third absolute time and the average hibernation time interval; and
a flash translation layer (FTL) suitable for performing a garbage collection operation based on whether the number of free blocks in the memory device is less than a threshold, calculating expected usage of the memory device during a monitoring time interval based on the system time, calculating excess usage based on actual usage of the memory device during the monitoring time interval and the expected usage, and changing the threshold until the excess usage is fully consumed.

12. The controller of claim 11, wherein the FTL increases the threshold until the excess usage is fully consumed.

13. The controller of claim 11, wherein the FTL calculates an elapsed time interval based on a use start time of the memory system and the system time.

14. The controller of claim 11, wherein the FTL performs the garbage collection operation by controlling the memory device to program valid data of a victim block into a target block and to perform an erase operation on the victim block.

15. The controller of claim 11, wherein the elapsed time calculator calculates a total hibernation time interval between the first and second absolute times based on the active state time interval between the first and second absolute times and one or more busy time intervals between the first and second absolute times, and calculates the average hibernation time interval based on the total hibernation time interval and a hibernation number between the first and second absolute times.

16. The controller of claim 15, further comprising:
a timer suitable for measuring the busy time intervals; and
a counter suitable for counting the hibernation number.

17. The controller of claim 11, wherein the elapsed time calculator calculates a total hibernation time interval after the third absolute time based on a hibernation number after the third absolute time and the average hibernation time interval in the active state time interval between the first and second absolute times, the third absolute time being subsequent to the active state time interval, and calculates the system time based on one or more busy time intervals after the third absolute time and the total hibernation time interval after the third absolute time.

18. The controller of claim 11, wherein the FTL updates a program/erase (P/E) cycle number that indicates repetitions of a program operation and erase operation performed on one or more memory blocks included in the memory device, and calculates the actual usage based on the P/E cycle number.

19. The controller of claim 11, wherein the FTL calculates the expected usage based on maximum usage, a guarantee period of the memory system, and the monitoring time interval, the maximum usage being determined based on a capacity and a lifespan of the memory device.

20. The controller of claim 11, wherein the inactive state comprises a sleep state and a power-off state.

* * * * *